United States Patent
Petz et al.

(10) Patent No.: US 7,495,882 B2
(45) Date of Patent: Feb. 24, 2009

(54) ELECTRONIC COMPONENTS COMPRISING ADJUSTABLE-CAPACITANCE MICRO-ELECTRO-MECHANICAL CAPACITORS

(75) Inventors: Felix Petz, Leiderdorp (NL); Manfred Wittig, Lisse (NL)

(73) Assignee: Agence Spatiale Europeenne, Paris Cedex (FR)

( * ) Notice: Subject to any disclaimer, the term of this patent is extended or adjusted under 35 U.S.C. 154(b) by 0 days.

(21) Appl. No.: 10/545,616

(22) PCT Filed: Feb. 17, 2004

(86) PCT No.: PCT/FR2004/000358

§ 371 (c)(1),
(2), (4) Date: Jul. 14, 2006

(87) PCT Pub. No.: WO2004/075247

PCT Pub. Date: Sep. 2, 2004

(65) Prior Publication Data

US 2006/0267558 A1    Nov. 30, 2006

(30) Foreign Application Priority Data

Feb. 18, 2003    (FR) .................................. 03 01934

(51) Int. Cl.
*H01G 5/00* (2006.01)
(52) U.S. Cl. ........................ 361/277; 324/661
(58) Field of Classification Search ................. 320/166; 324/415, 558, 649, 654, 658, 661; 307/21–26, 307/37, 109, 409; 361/277; 315/39, 39.3, 315/39.55, 39.61, 355, 357
See application file for complete search history.

(56) References Cited

U.S. PATENT DOCUMENTS

| | | | | |
|---|---|---|---|---|
| 4,483,194 | A | 11/1984 | Rudolf | |
| 5,134,881 | A | 8/1992 | Henrion et al. | |
| 5,526,172 | A * | 6/1996 | Kanack | 359/291 |
| 6,066,536 | A | 5/2000 | Lin | |
| 6,577,113 | B2 * | 6/2003 | Sill et al. | 324/72.5 |
| 6,744,335 | B2 * | 6/2004 | Ryhanen et al. | 333/185 |
| 6,980,412 | B2 * | 12/2005 | Cheng et al. | 361/277 |

(Continued)

FOREIGN PATENT DOCUMENTS

EP    0 637 042    2/1995

(Continued)

*Primary Examiner*—Akm E Ullah
*Assistant Examiner*—M'Baye Diao
(74) *Attorney, Agent, or Firm*—Young & Thompson

(57) ABSTRACT

Electronic component comprising at least one micro-electro-mechanical capacitor with adjustable capacitance comprising two electrodes free to move with respect to each other, and a control circuit (30) comprising measurement means (32) to measure the capacitance of the capacitor, means (35) of determining a capacitance difference between the measured capacitance of the capacitor and a set capacitance value, means (35 to 38) for injecting an electrical charge in a control electrode so as to create an electrostatic force capable of moving one of the two electrodes with respect to the other electrode and thus adjusting the capacitance of the capacitor, the injected electrical charge being determined as a function of the capacitance difference. This component is suitable for making an adjustable delay line, an adjustable quarter wave impedance transformer or for measuring the voltage, the power or the average intensity of an electrical signal.

20 Claims, 5 Drawing Sheets

U.S. PATENT DOCUMENTS

| | | | |
|---|---|---|---|
| 7,054,132 B2 * | 5/2006 | Yoshida et al. | 361/277 |
| 2002/0075626 A1 | 6/2002 | Liu et al. | |
| 2002/0079743 A1 | 6/2002 | Ma et al. | |
| 2003/0117152 A1 * | 6/2003 | Murphy | 324/661 |
| 2004/0075967 A1 * | 4/2004 | Lynch et al. | 361/277 |

FOREIGN PATENT DOCUMENTS

| | | |
|---|---|---|
| EP | 0 647 840 | 4/1995 |
| WO | WO01/45119 | 6/2001 |

\* cited by examiner

ELECTRONIC COMPONENTS COMPRISING ADJUSTABLE-CAPACITANCE MICRO-ELECTRO-MECHANICAL CAPACITORS

This invention relates to electronic components with micro-electromechanical capacitors and electronically adjustable capacitance.

It is particularly but not exclusively applicable to microwave frequency systems such as phased array antenna systems with electronic scanning.

In many applications in the microwave frequencies range, capacitors with adjustable capacitance are used to perform signal delay, phase shift or even impedance matching functions. Delay, phase shift or impedance usually need to be adjustable and controllable in these applications.

At the present time, electronically adjustable delay lines are based on the use of semiconductor diodes such as varactors, Schottky diodes or tunnel effect diodes. Such diodes operate on a wide frequency band and have excellent behaviour concerning their response to very short pulses. However, such diodes also have a large number of disadvantages that limit their use. They are not capable of resisting high voltages or high powers. Their characteristics are very sensitive to temperature variations. They create excessive noise level, such that their quality factor Q is low, although they are not well adapted for use in filters and delay lines that can be used in the microwave frequencies range.

Furthermore, Micro-ElectroMechanical (MEM) components are made that can be used as switches or capacitors with variable capacitance without the disadvantages of a semiconductor diode. In particular, such a component has a high Q factor and generates low noise. It usually comprises a fixed electrode and a mobile electrode, the position of which is adjusted using an electrostatic force generated by an electric field applied to the mobile electrode.

However, since the capacitance of such a capacitor is adjusted by mechanically varying the distance between electrodes, the adjustment speed is relatively low (>10 µs) which makes such a capacitor unsuitable for applications requiring a very fast pulse response. Furthermore, the voltage necessary to generate an electrostatic force capable of displacing the mobile electrode is relatively high, of the order of 30 V.

Furthermore, such a MEM Capacitor is difficult to control in variable capacitance mode. Indeed, when a clean voltage is applied to the terminals of the capacitor, an electrostatic attraction force appears between the electrodes, which reduces the distance between the electrodes. The result is that the electric field between the electrodes increases, and therefore the attraction electrostatic force also increases. Therefore starting from a certain voltage threshold, the distance between the two electrodes becomes uncontrollable and the mobile electrode comes into contact with the fixed electrode, setting up the electrical contact. The result is that the component behaves like an electronically controlled switch.

The purpose of this invention is to eliminate these disadvantages. This objective is achieved by providing an electronic component comprising at least one micro-electromechanical capacitor with adjustable capacitance comprising two electrodes free to move with respect to each other.

According to the invention, this component comprises a control circuit comprising measurement means for measuring the capacitance of the capacitor, means for determining a capacitance difference between the measured capacitance of the capacitor and a set capacitance value, means of injecting an electric charge into a control electrode so as to create an electrostatic force capable of moving one of the two electrodes with respect to the other electrode and thus adjusting the capacitance of the capacitor, the injected electric charge being determined as a function of the difference in capacitance.

Advantageously, the capacitance measurement means of the capacitor include an alternating current source.

According to one feature of the invention, the injection means of an electric charge comprise a pulsed current source.

Advantageously, the component according to the invention is integrated with the control circuit into an integrated circuit.

According to one preferred variant of the invention, the control electrode is one of the two electrodes of the capacitor.

Preferably, the frequencies of the alternating current source and the pulsed current source are lower than and remote from the frequencies of signals processed by the component.

According to another preferred variant of the invention, the control electrode is mechanically coupled to one of the two electrodes and is electrically isolated from it.

According to another preferred embodiment of the invention, this component comprises a plurality of micro-electromechanical capacitors with adjustable capacitance each comprising a first and a second electrode free to move with respect to each other, the first capacitor electrodes being interconnected in series by conducting tracks in the form of a winding and each forming an inductance, so as to form a chain of electrodes, the ends of which are connected to two corresponding connection terminals of the component through two corresponding conducting tracks in the form of a winding, each forming an inductance, the second electrodes of the capacitors being connected to a ground plane.

According to another preferred variant of the invention, one of the two electrodes has two connection terminals and a length between the two connection terminals equal to a quarter of the wavelength of the signals processed by the component, so as to form a quarter wave impedance transformer.

According to another preferred variant of the invention, this component comprises a plurality of micro-electromechanical capacitors with adjustable capacitance comprising two electrodes free to move with respect to each other, one of the mobile electrodes in each of the capacitors having two connection terminals connected to corresponding connection terminals of the component and the corresponding lengths between the two connection terminals being different from each other, so as to form a set of quarter wave impedance transformers connectable in series, so as to adapt the total length of capacitors interconnected in series to the wavelength of the signals processed by the component.

According to another preferred variant of the invention, this component is used to measure at least one characteristic of a signal applied to one of the two electrodes of the capacitor, the control circuit being designed to keep the distance between the electrodes of the capacitor constant, independently of the signal applied to one of the two electrodes.

Advantageously, the control circuit is coupled to means of measuring the voltage applied to the control electrode, that is proportional to the average voltage of the signal applied to one of the two electrodes.

According to one preferred variant of the invention, the distance between the two electrodes is balanced in the absence of a signal, the control circuit including means of keeping the distance between the electrodes at a value other than the equilibrium value.

According to another preferred variant of the invention, this component is used to measure the average power of the signal applied to one of the two electrodes.

According to another preferred variant of the invention, this component is used to measure the average intensity of the signal applied to one of the two electrodes.

Preferred embodiments of the invention will be described below, as non-limitative examples, with reference to the attached drawings in which:

FIG. 1 diagrammatically shows a perspective view of an integrated electronic component according to the invention, performing the function of an adjustable delay line;

Figure 6:
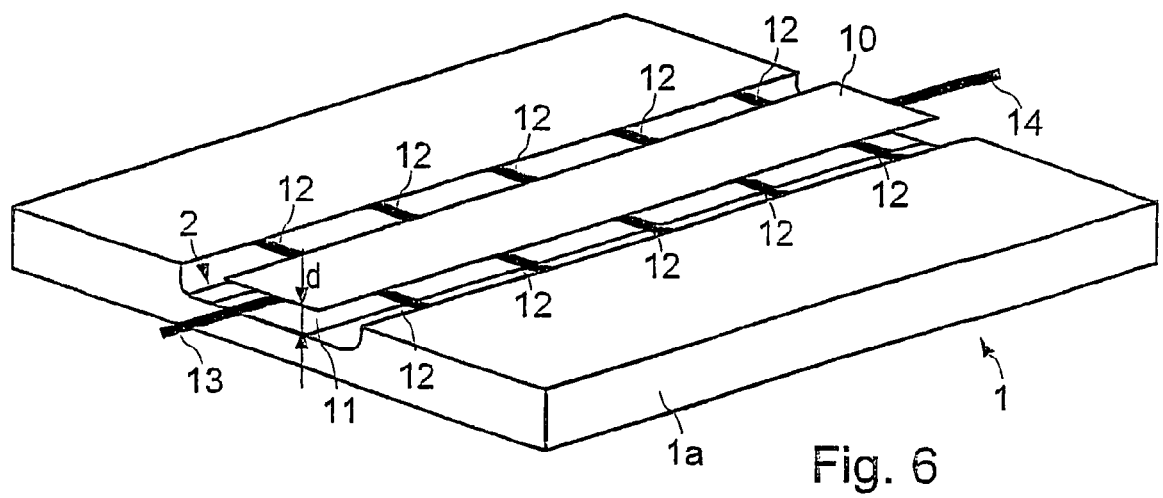
Figure 7:
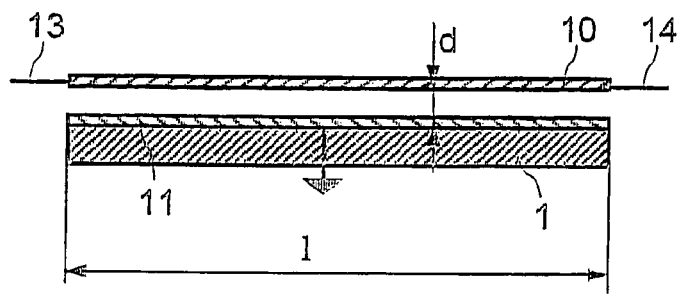
Figure 8:
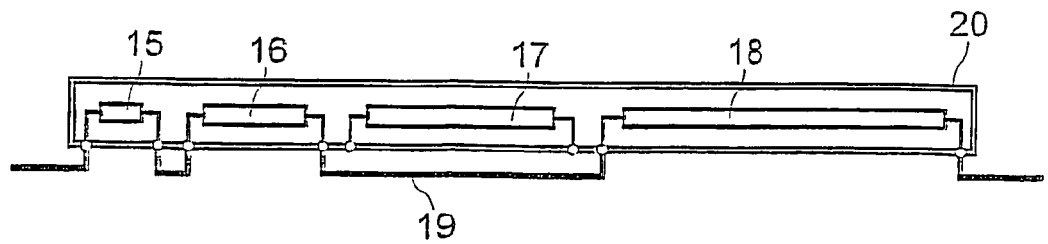
Figure 9:
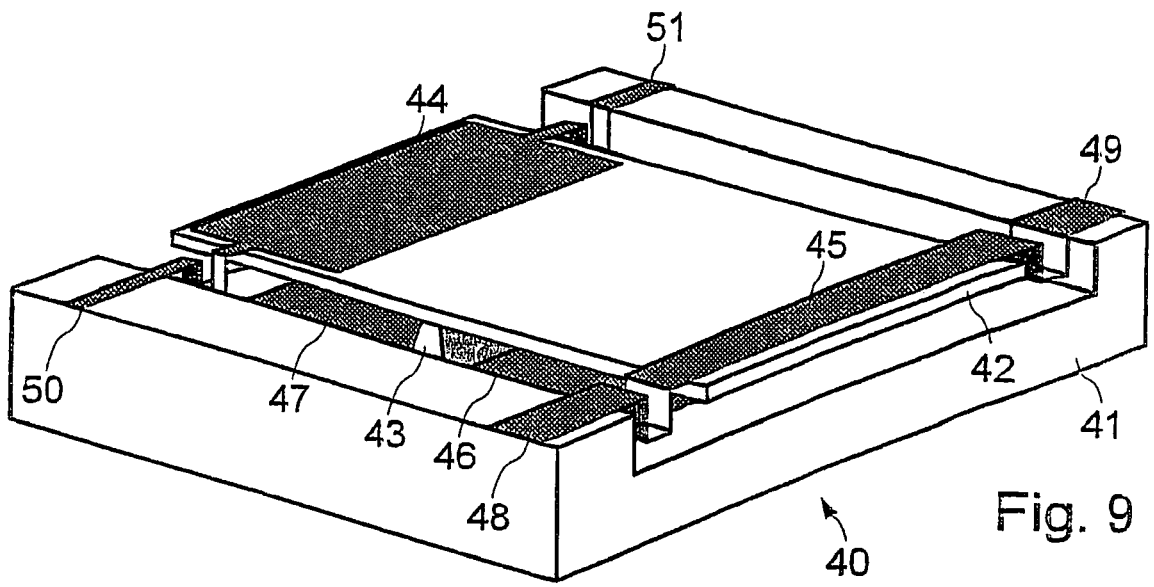
Figure 10:
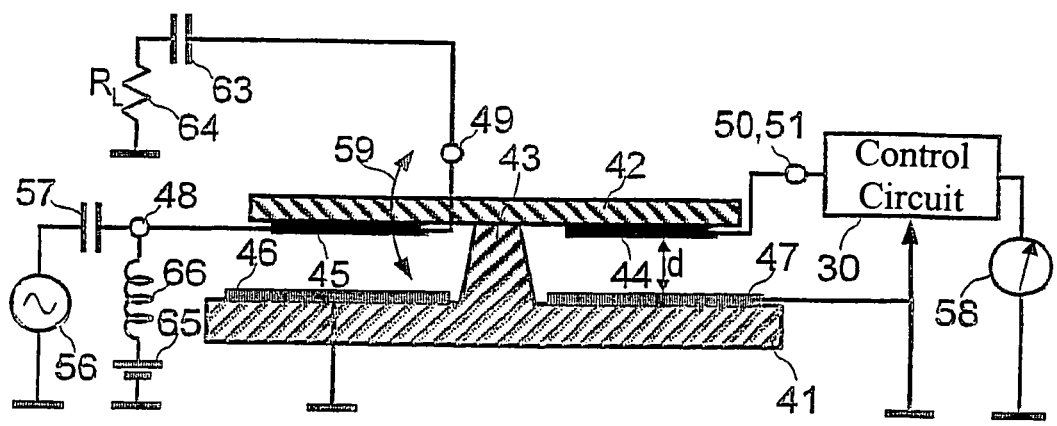
Figure 11:
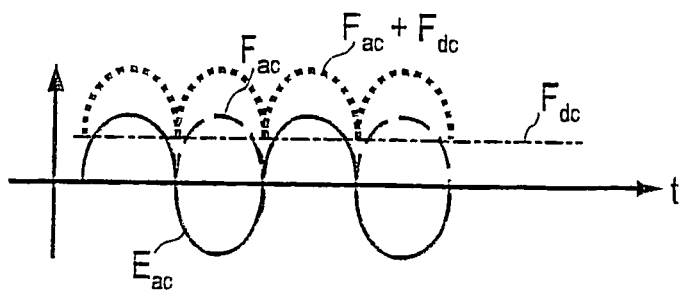
Figure 12:
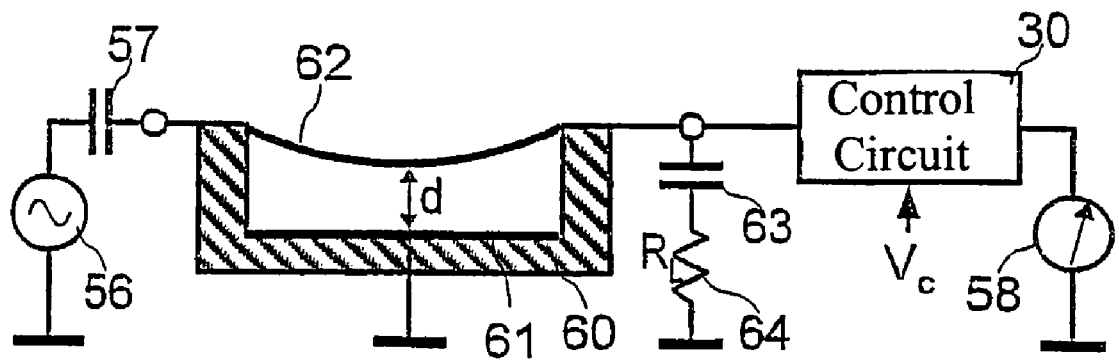
Figure 13:
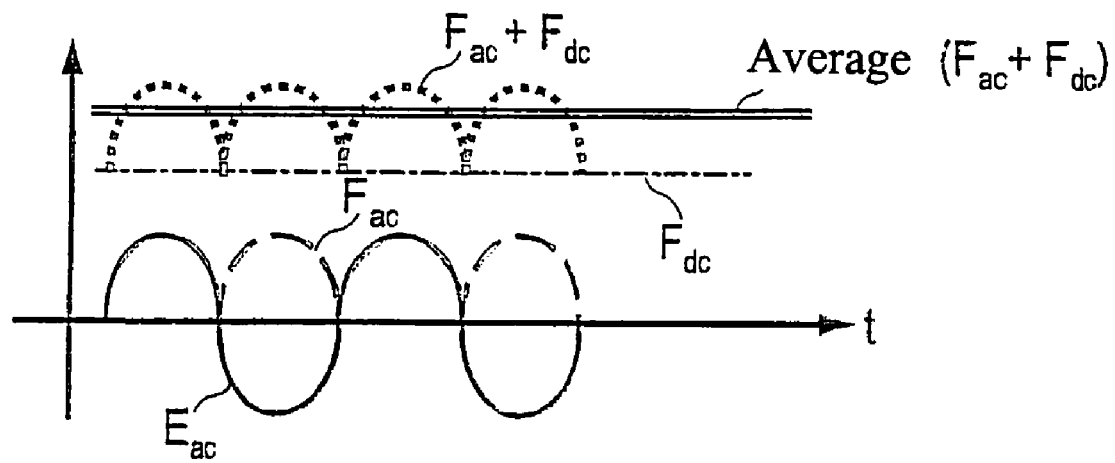

FIG. 6 diagrammatically shows a perspective view of an integrated electronic component according to the invention, performing the quarter wave impedance transformer function;

FIG. 7 shows a cross-sectional view of the impedance transformer shown in FIG. 6;

FIG. 8 shows a housing containing several impedance transformers according to the invention;

FIG. 9 diagrammatically shows a perspective view of an integrated electronic component used to make current, voltage or signal power measurements;

FIG. 10 shows a cross-sectional view of the component shown in FIG. 9 associated with a control and measurement circuit;

FIG. 11 illustrates operation of the circuit shown in FIG. 10 in the form of curves;

FIG. 12 diagrammatically shows a cross-sectional view of a variant of the electronic component shown in FIGS. 9 and 10, associated with a control and measurement circuit;

FIG. 13 illustrates operation of the circuit shown in FIG. 12, in the form of curves.

Figure 1:
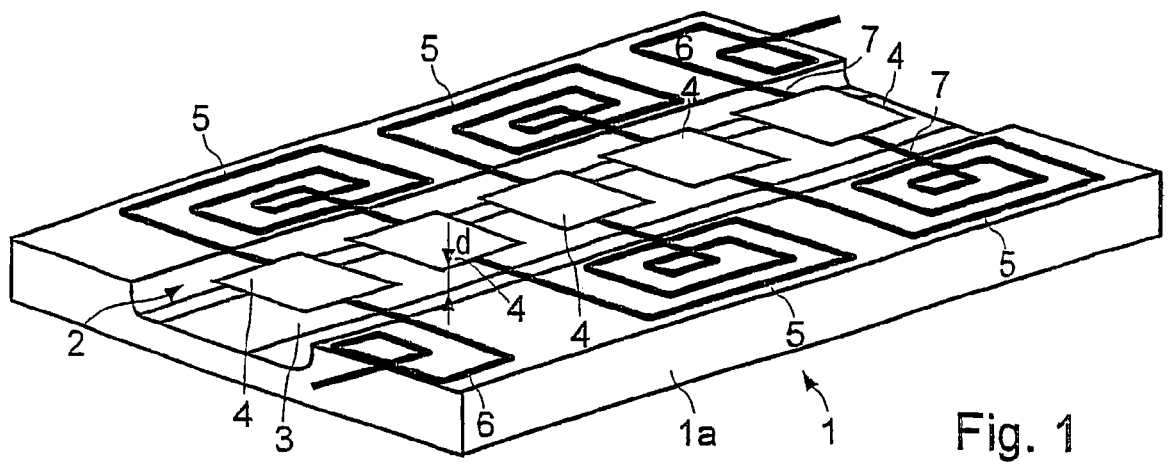

The integrated component shown in FIG. 1 is composed of an insulating substrate 1a in which a groove 2 is made, and a conducting area 3, for example with a rectangular shape, is formed at the bottom of the groove forming a first electrode of a plurality of capacitors. The component 1 also comprises mobile conducting plates 4 suspended by mechanical suspensions 7 approximately parallel and facing the conducting area 3, so as to form corresponding capacitors with it, with a mobile electrode free to move along an axis perpendicular to the plane of the conducting area 3. The conducting area 3 and the plates 4 are approximately the same width. Therefore the value of the capacitance C of each capacitor 3, 4 depends on the distance d between the conducting area 3 and the corresponding plate 4. The conducting area 3 is connected to a ground plane of the component, while the conducting plates 4 are interconnected in series through conducting tracks 5 connecting the mechanical suspensions of the plates to each other, each of these conducting tracks being made on a substrate 1 on each side of the groove 2 in the form of a winding with an inductance L. The plates 4 located at the two ends of the groove 2 are also connected through one of their corresponding mechanical suspensions to a conducting track 6 also forming a winding with an inductance equal to L/2, the other end of each of the conducting tracks 6 forming a corresponding connection terminal of the component 1.

Figure 2:
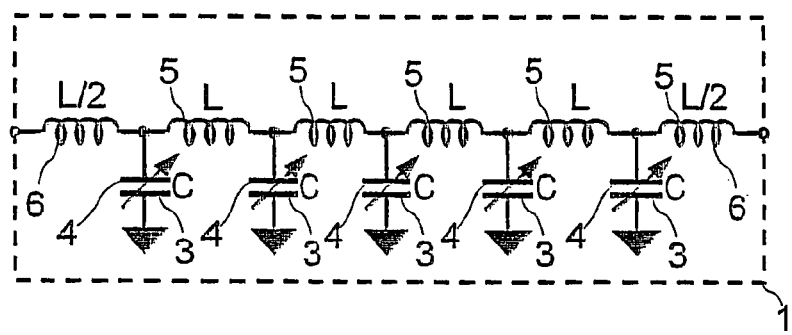
FIG. 2 shows a diagrammatic representation of the electronic circuit corresponding to the delay line shown in FIG. 1.

FIG. 2 diagrammatically shows the electronic circuit formed by the integrated component 1. It performs the function of a delay line.

The impedance of the delay line thus formed can be obtained using the following formula:

$$z_0 = \sqrt{\frac{L}{C}} \quad (1)$$

The phase shift $\phi$ obtained using this delay line is calculated as follows:

$$\tan\phi = \omega\sqrt{LC} \quad (2)$$

The component 1 that has just been described is perfectly suitable for use both in broadband applications such as in the emission part (power amplifier and individual controls for antenna elements) of electronic scanning antenna networks and signal delay compensators, or for narrow band applications such as phase shifters.

Figure 3:
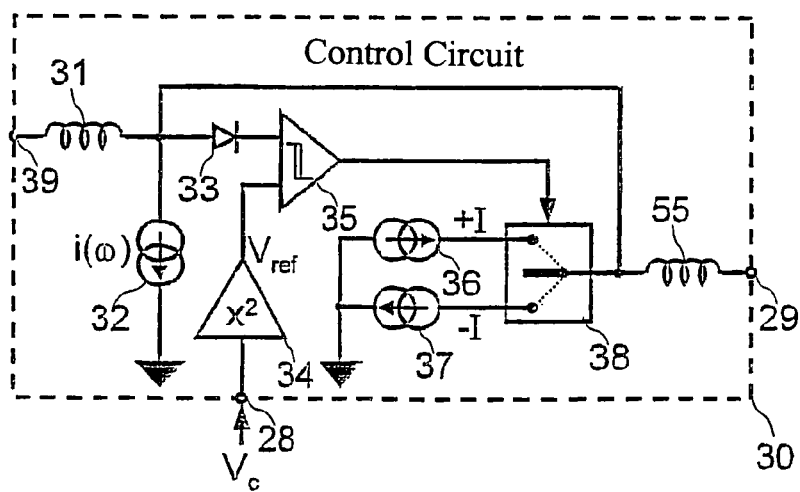
FIG. 3 shows an electronic circuit used to control the delay line shown in FIG. 1.

A control circuit 30 shown in FIG. 3 can be used to adjust the capacitances of the capacitors 3, 4 of the component 1.

This control circuit comprises an alternating current source 32 outputting a measurement current $i(\omega)$ that is applied firstly to an input/output terminal 39 of the circuit 30 through a filter inductance 31, and secondly to an input of a comparator 35 through a diode 33 mounted directly, to rectify the signal applied to the comparator. Another input of the comparator 35 is connected to a control input 28 of the control circuit, possibly through an amplifier 34 designed to square the control voltage $V_C$ applied to the control input of the circuit, such that the voltage $V_{ref}$ applied to the comparator 35 is equal to $V_C^2$. The output from the comparator 35 is connected to a control input of a switch 38 comprising a connection terminal connected to a first Dc current source 36 outputting a current with an intensity equal to +I, a connection terminal connected to a second Dc current source 37 outputting a current with an intensity equal to −I, the inverse of that output by the first Dc current source, and a third connection terminal looped back onto the input/output terminal 39 of the circuit 30. The switch 38 is designed to establish contact between the third terminal and either the first terminal or the second terminal depending on the control value provided by the comparator 35, so as to inject a charge $\Delta Q$ equal to + or −I$\Delta$t into the capacitors 3, 4 of the component 1, where $\Delta$t represents the time during which the switch remains in the same state.

The control circuit 30 that has just been described is designed to be connected in parallel to the component 1 to be controlled.

The alternating current source 32 outputs a current $i(\omega)$ used to measure the value of the capacitance of the component 1. To achieve this, the frequency of the current output by this source is less than and sufficiently different from the frequency of signals processed by the component so that it does not interfere with them. The current source 32 can be used to obtain a voltage inversely proportional to the capacitance C of the capacitor(s) to be measured, as shown by the following formula:

$$V = \frac{i(\omega)}{C\omega} \quad (3)$$

where $\omega$ is the angular frequency of the current $i(\omega)$ output by the current source 32.

The voltage V is compared with the voltage $V_{ref}=V_c^2$ by the comparator 35, where $V_C$ corresponds to a set capacitance value equal to:

$$C = \frac{i(\omega)}{\omega V_{ref}} \quad (4)$$

Therefore according to formula (1), the impedance of the component 1 is slaved to the following value:

$$z = \sqrt{\frac{L}{C}} = \sqrt{\frac{kL\omega}{i(\omega)}} V_c \quad (5)$$

To achieve this result, the comparator 35, which may for example be a Schmitt trigger with hysteresis, controls a positive or negative charge injection $\Delta Q$ as a function of the result of the comparison between the input voltage 39 and the voltage $V_{ref}$. More precisely, the injected charge is equal to $-I\Delta t$ if $V < V_{ref} - \Delta V$, or $+I\Delta t$ if $V > V_{ref} + \Delta V$.

Therefore, the assembly comprising the comparator assembly 35, the current sources 36, 37 and the switch 38 form a pulsed current source for which the pulses have a constant width $\Delta t$ that is determined by the difference between the two thresholds of the hysteresis comparator 35. $\Delta t$ is chosen slightly greater than the mechanical response time of variable capacitors 3, 4 of the component, for example 10 μs if this response time is slightly less than this value, which corresponds to a frequency of the order of 100 kHz. It is also important to make sure that this frequency will not interfere with the signal processed by the component 1.

The circuit that has just been described may for example be applicable to a signal processed by the component 1 with a frequency greater than 100 MHz, the frequency of the current generated by the current source 32 being chosen to be of the order of 10 MHz, while the frequency of the signal at the output of the comparator 35 is of the order of 100 kHz.

Obviously, instead of using the delay line 1 of the capacitors for which the distance d between the plates 3, 4 is adjusted by applying an electrostatic field to the plates, capacitors could be used for which the distance between the plates is adjusted by another control capacitor for which the plates are fixed to plates 3, 4 respectively. In this case, risks of interaction between the signal processed by the component 1 and the charge injection signal are avoided. Furthermore, instead of measuring the capacitance C of active capacitors through which the signal processed by the component passes, the capacitance of the control capacitors can be measured and varies proportionally to the capacitance of the active capacitors of the component. A single control capacitor could also be provided to simultaneously adjust all mobile plates 3 of the active capacitors of the component.

The control circuit that has just been described has the advantage of being simple and robust, but it may cause modulation of signals passing through the component 1 at the frequency of control actions, namely $1/\Delta t$. This unwanted modulation may be minimised by reducing the hysteresis as much as possible, depending on the reaction speed of the capacitors with variable capacitance, so as to minimise the modulation frequency. Although this control circuit is suitable in most cases, it may be necessary to provide another control circuit without this disadvantage for some specific applications.

Figure 4:
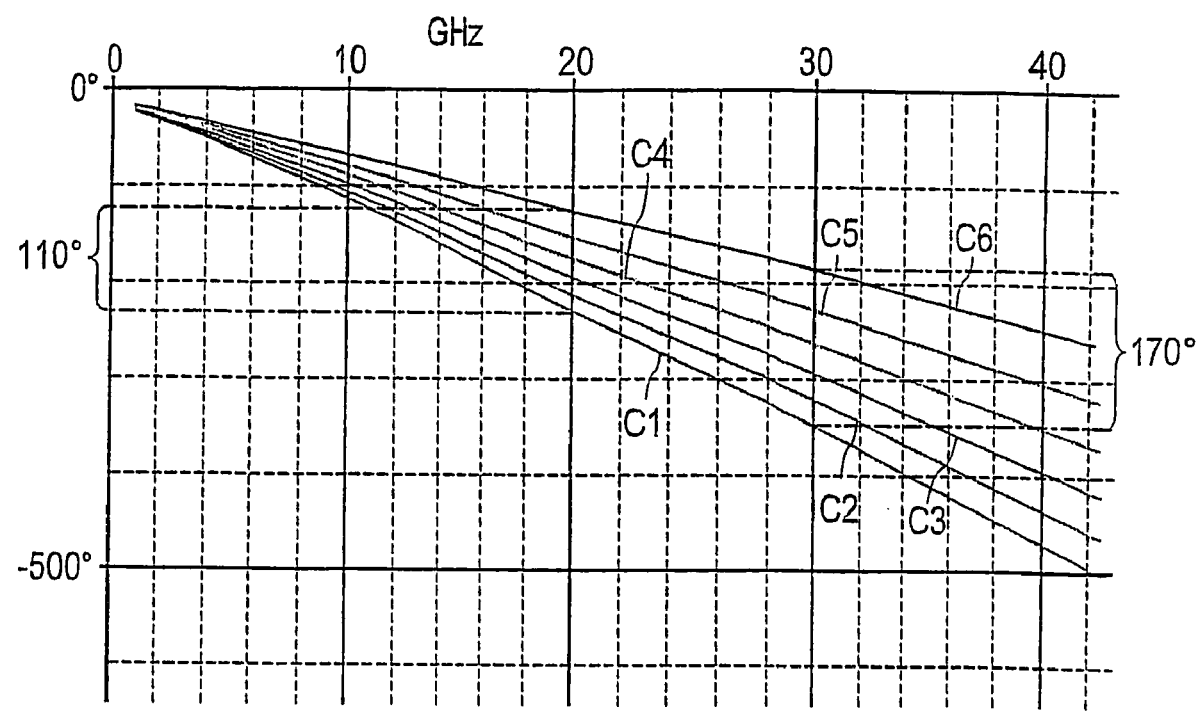
FIGS. 4 and 5 illustrate the performances of the component shown in FIG. 1, in the form of curves.

FIG. 4 shows the phase shift variation curves C1 to C6 introduced by a delay line like that shown in FIGS. 1 and 2, as a function of the frequency, for six capacitance values C located between a maximum value (curve C1) and a minimum value (curve C6). These curves show that the phase shift introduced with the delay line increases with the frequency and the capacitance of the capacitors 3, 4 and can be adjusted over about 110° at 20 GHz and about 170° at 30 GHz.

Figure 5:
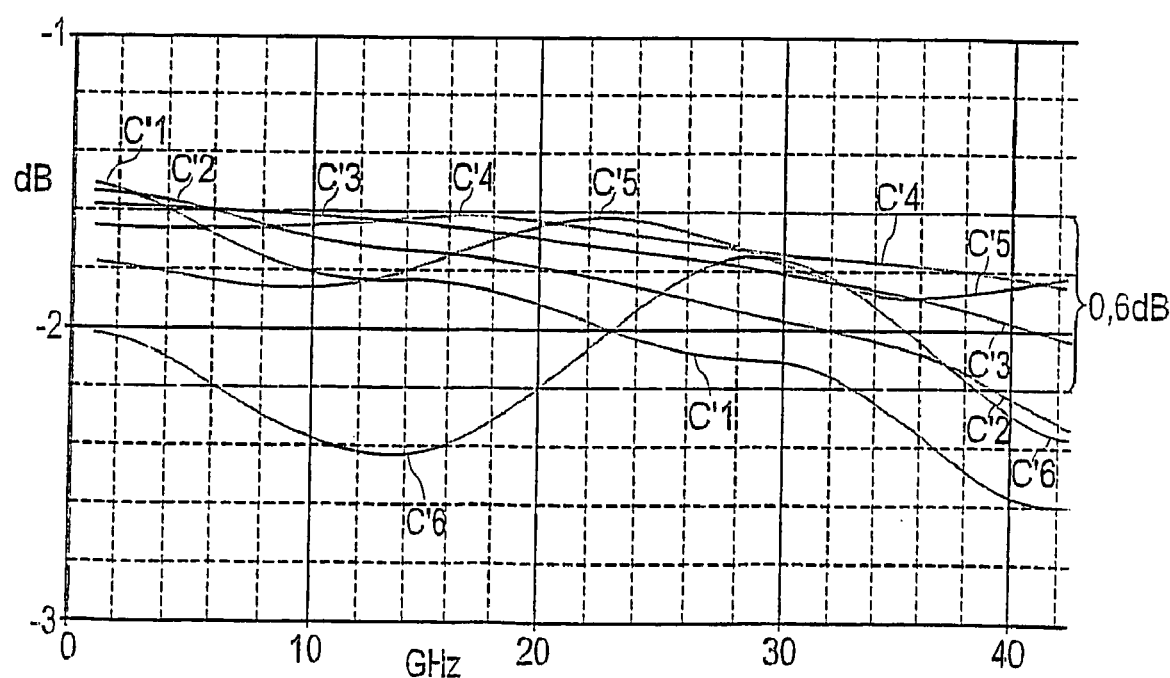

FIG. 5 contains curves C'1 to C'6 showing the variation of the insertion losses as a function of the frequency for the six capacitance values C corresponding to curves C1 to C6 respectively in FIG. 4. The curves in this Figure show that insertion losses remain less than 3 dB for a frequency less than 40 GHz, but tend to increase with the frequency. These curves also show that the variation amplitude of insertion losses reduces when the capacitance is increased, and that the average gradient of the increase of these losses with the frequency increases with the capacitance.

The concept of an adjustable micro-electromechanical capacitor associated with the control circuit 30 may also be applied to a quarter wave impedance transformer. One example of such a component is shown in FIGS. 6 and 7. The component 1' shown in these figures also comprises a substrate 1a made from an insulating material in which a groove 2 is formed, with a conducting area 11 formed at the bottom of the groove. A conducting plate 10 is formed suspended by mechanical suspensions 12 approximately parallel to each other and facing the conducting area 11. In this way, the conducting plate 10 also forms a mobile electrode of a capacitor, the capacitance of which is variable and depends on the distance d between the conducting plate 10 and the conducting area 11. The conducting area 11 and the plate 10 have approximately the same dimensions. The conducting plate 10 comprises two connection terminals 13, 14 with an external circuit at the two ends of the groove 2.

The length l of the plate 10 between the connection terminals 13, 14 is advantageously a multiple of the quarter of the wavelength of the signal applied to the terminals 13, 14.

In this manner, the component thus described forms a quarter wave transformer for which the impedance $Z_0'$ is variable and equal to:

$$Z_0' = \sqrt{\frac{L'}{C'}} \quad (6)$$

L' and C' are the inductance and capacitance respectively of the component, C' being variable and adjustable as a function of the distance d between the plate 10 and the conducting area 11.

Since the length l of the conducting track or the plate depends on the frequency band in which the component is used, it is necessary to provide a specific component with an appropriate length l for each frequency band.

This problem is advantageously solved by integrating several quarter wave transformers 15 to 18 like that described above in the same housing 20, as shown in FIG. 8, these components having different lengths l and being connectable to each other through means external to the housing 20. By choosing the components of the housing connected in series appropriately, a quarter wave transformer with the required length can be obtained equal to the sum of the corresponding lengths l of transformers 15 to 18 connected in series. In the example in FIG. 8, the transformers 15, 16 and 18 are connected to each other in series.

The impedance transformer that has just been described is perfectly suitable for use as an impedance matcher or an output impedance transformer for Solid State Power Amplifiers (SSPA), or for controlling the Voltage Standing-Wave Ratio (VSWR).

The concept of a variable micro-electromechanical capacitor associated with the control circuit 30 may also be applied to a device for measuring an electrical signal for measuring its average voltage, the average intensity or the average power. One example of such a component is shown in FIGS. 9 and 10. The component 40 shown in these Figures also includes a substrate 41 made from an insulating material comprising a central recess on which a straight rib 43 is formed, and electrically conducting areas 46, 47 on each side of the rib in the recess. The rib 43 forms a pivot for an electrically isolating pivoting plate 42, also comprising two electrically conducting areas 44, 45 facing the conducting areas 46, 47. Each of the conducting areas 44, 45 is elastically connected to two connection areas 48, 49 and 50, 51 respectively, formed on the substrate 41 at an equal distance from the rib 43.

Therefore the component that has just been described includes two capacitors formed by the conducting areas firstly 45, 46, and secondly 44, 47, the plate 42 pivoting to one side or the other (along the double arrow 59) as a function of the corresponding forces applied between the conducting areas of the two capacitors.

Note that the conducting areas 44, 45 formed on the plate 42 may indifferently be formed on the upper face of the plate (FIG. 9) or the lower face of the plate, facing the conducting areas 47, 46 formed in the recess of the substrate (FIG. 10).

In FIG. 10, the signal to be measured is output from a source 56 connected through a decoupling capacitor 57 to the connection terminal 48 of the mobile conducting area 45 of the capacitor formed by the conducting areas 45, 46. The other connection terminal 49 of the conducting area 45 is connected to a load resistance $R_L$ 64 through a decoupling capacitor 63. The other conducting area 46 is connected to the ground. A control circuit such as the circuit 30 described above is connected to a connection terminal 50 or 51 of the mobile conducting area 44 of the capacitor formed from the conducting areas 44, 47, to adjust the distance d of the conducting areas 44 and 47 and therefore the distance of the conducting areas 45 and 46, the conducting area 47 being connected to the ground.

Moreover, in order to obtain a measurement of the signal output from the source 56, the control circuit 30 also comprises a connection terminal 29 designed to be connected to a measurement instrument 58, the connection terminal 29 being connected through an isolating inductance 55 to the output of the switch 38, in other words to the junction point between the diode 33 and the current source 32 (see FIG. 3).

FIG. 11 illustrates operation of the measurement device shown in FIG. 10, in the form of curves (alternating current wave form) as a function of time. The signal to be measured output from the source produces an electrostatic field $E_{ac}$ between the conducting areas 45, 46, for example in alternating form. This field generates an electrostatic attraction force $F_{ac}$ which has the same shape as the field $|E_{ac}|$ (absolute value). A constant electrostatic field $E_{dc}$ is generated on the other capacitor 44, 47 by injecting charges $\Delta Q$, which produces an electrostatic force $F_{dc}$ that is also constant. FIG. 11 also shows the sum of the electrostatic forces $F_{ac}$ and $F_{dc}$ that have the same shape as the force $F_{ac}$, but is offset from the time axis by a value equal to $F_{dc}$.

According to one special feature of the invention, the distance d between the electrodes of the capacitor 44, 47 (and therefore the distance separating the electrodes 45, 46) is controlled by the control circuit 30 so as to be kept constant. The result is that the value of the capacitance of capacitors formed by the conducting areas 44, 47, and 45, 46 must be kept constant. Therefore the voltage $V_c$ applied to the input of the control circuit 30 must be held at a constant value that determines the value of the capacitance of the second capacitor (formed by the conducting areas 44, 47). Therefore the voltage to be measured is proportional to the voltage between the conducting areas 44, 47 resulting from the charges that the control circuit injected into it to keep the distance d between these areas constant.

The electrostatic forces are in the form:

$$F_e = k_e \frac{V^2}{d} \tag{7}$$

where $k_e$ is constant and V is the voltage applied to the terminals of the capacitor, consequently the voltage of the signal to be measured is proportional to the voltage measured by the measurement instrument 58. Therefore a simple voltmeter provides a voltage measurement proportional to the voltage to be measured.

The power of the signal to be measured is deduced from the measured voltage using the following formula:

$$P = \frac{V^2}{R_L} \tag{8}$$

where $R_L$ is the load resistance 64 of the circuit in which the signal to be measured is routed.

To measure the intensity of the signal current to be measured, it is necessary to short circuit the load resistance (in this case $R_L=0$). The result is that the mechanical force generated in the capacitor 45, 46 is not an electrostatic force, but rather a repulsive electromagnetic force with the following form:

$$F_{ac} = K_I \frac{I_{ac}^2}{d} \tag{9}$$

where I is the average intensity to be measured, d is the distance between the conducting areas 45 and 46, and $k_I$ is a constant.

Therefore, it appears necessary to add a source 65 of DC voltage $V_p$ in parallel with the source 56 of the signal to be measured, so as to apply a prestress to the pivoting plate 42 supporting the conducting areas 44, 45, the source 65 being installed in series with a decoupling inductance 66. This voltage source generates a compensating electrostatic force $F_p$ applied to the pivoting lever 42, in the following form:

$$F_p = k_p \frac{V_p^2}{d} \tag{10}$$

where $k_p$ is a constant.

The voltage $V_p$ is chosen so as to obtain equilibrium of forces applied to the lever 42 when the signal to be measured $V_{ac}$ is not present. Therefore:

$$F_p = K_p \frac{V_p^2}{d} = F_{dc} = K_{dc} \frac{V_{dc}^2}{d} \tag{11}$$

where $F_{dc}$ is the electrostatic force applied to the plate 42 and generated by the voltage $V_{dc}$ applied to the capacitor by the control circuit 30 and measured by the voltmeter 58, and $k_{dc}$ is a constant.

The result is that $V_p$ is chosen to be equal to the following value:

$$V_p = \sqrt{\frac{K_{dc}}{K_p}V_{dc}} \quad (12)$$

When the pivoting plate 42 is in equilibrium in the presence of a signal $V_{ac}$ to be measured, the electrostatic force $F_{dc}$ produced by the control circuit 30 is equal to the electrostatic compensation force $F_p$ produced by the source 65, minus the magnetic force $F_{ac}$ in the opposite direction:

$$F_p - F_{ac} = K_p \frac{V_p^2}{d} - K_I \frac{I_{ac}^2}{d} = F_{dc} = K_{dc}\frac{V_{dc}^2}{d} \quad (13)$$

where $K_{dc}$ is a constant and V is the voltage measured using the voltmeter 58. The result is that:

$$K_I I_{ac}^2 = K_p V_p^2 - K_{dc} V_{dc}^2 \quad (14)$$

Therefore, equation (14) shows that the average intensity of the signal to be measured is deduced directly from the voltage $V_{dc}$ measured by the voltmeter 58.

Another example of an adjustable micro-electromechanical capacitor is shown in FIG. 12. Such a capacitor may also be used to make a measurement of an average voltage, average intensity and average power of a signal. In this example, the adjustable micro-electromechanical capacitor 60 is of the membrane type. For example, such a capacitor is described in U.S. Pat. No. 6,100,477. It is formed from a cavity, the bottom of which is covered by an electrically conducting material to form an electrode 61 of a capacitor, above which a conducting elastic membrane 62 is located forming the second electrode of the capacitor. The membrane 62 is designed to bend towards the bottom of the cavity under the effect of an electric field applied between the electrodes of the capacitor. The signal to be measured is applied to the membrane 62, while the electrode 61 is connected to the ground. Furthermore, the membrane 62 is connected in parallel to a control circuit like the circuit 30 shown in FIG. 3.

To prevent a non-linearity phenomenon occurring in the measurements due to the fact that the membrane cannot bend under the effect of an electric field and move away from the other electrode 61, the membrane is prestressed under the effect of a prestress voltage that keeps it bent when there is no signal to be measured, in the configuration shown in FIG. 12.

As previously, the charge injected in the membrane 62 is adjusted so as to keep the distance d between the central part of the membrane and the electrode 61 constant, the voltage, power and intensity of the current of the signal to be measured 56 being deduced from the value of the injected charge, in other words the voltage measured by the voltmeter 58.

The control voltage $V_c$ applied to the control input 28 of the control circuit corresponding to the prestress to be applied to the membrane 62.

The source 56 of the signal to be measured is connected to a connection terminal of the membrane 62 through an isolating capacitor 57. The other connection terminal of the membrane is connected firstly to the control circuit 30 and secondly through an isolating capacitor 63 to a load resistance $R_L$ 64, the other terminal of which is grounded.

At equilibrium in the lack of a signal source 56 to be measured, the mechanical force $F_k$ resulting from the elasticity of the prestressed membrane, balances the electrostatic force $F_{dc0}$ generated by the control circuit 30 to which a set voltage $V_{c0}$ is applied corresponding to the voltage $V_{ref0}$:

$$F_k = k(D - d) = F_{dc0} = k_{dc}\left(\frac{V_0^2}{d}\right) \quad (15)$$

where D is the distance between the membrane 62 and the conducting area 61 when there is no prestress, k being an elasticity constant of the membrane and $V_0$ being the voltage measured using the voltmeter 58.

In the presence of the signal to be measured, the membrane 62 is kept in equilibrium at a distance d from the conducting area 61, and is therefore still subjected to the mechanical force $F_k$ and also to the electrostatic force $F_{dc}$ produced by the control circuit 30 and the electrostatic force $F_{ac}$ produced by the voltage of the signal to be measured:

$$F_k = F_{dc0} = F_{dc} + F_{ac} = \frac{k_{dc}}{d}(V^2 + V_{ac}^2) \quad (16)$$

Equations (15) and (16) show that the average voltage of the signal to be measured is as follows:

$$V_{ac}^2 = V_0^2 - V_{dc}^2 \quad (17)$$

where V is the voltage measured by the voltmeter 58.

Therefore, the voltage $V_{ac}$ to be measured is deduced from the voltage V measured by the voltmeter.

FIG. 13 illustrates operation of the measurement device shown in FIG. 12 as a function of time, in the form of curves. The signal to be measured output from the source produces an electrostatic field $E_{ac}$ between the conducting areas 61, 62 of the capacitor, for example in alternating form. This field generates an electrostatic attraction force $F_{ac}$ that has the same form as the field $E_{ac}$ but for which the negative alternations are rectified. A constant electrostatic field $E_{dc}$ is also generated on the capacitor using the control circuit 30 that injects charges $\Delta Q$, which produces an electrostatic force $F_{dc}$ that is also constant. FIG. 13 also shows the sum of the electrostatic forces $F_{ac}$ and $F_{dc}$ that have the same shape as the force $F_{ac}$, but are offset from the time axis by a value equal to $F_{dc}$. This Figure also shows the average value of $F_{ac}+F_{dc}$.

The power of the signal to be measured is also deduced from the voltage by applying formula (8).

The intensity of the signal to be measured is also obtained by short circuiting the resistance $R_L$, which causes the appearance of a repulsive electromagnetic force between the membrane 62 and the conducting area 61, of the form defined by equation (9).

The equilibrium of the membrane 62 that is held at a distance d from the conducting area 61, may be represented by the following equation:

$$F_k + F_{ac} = F_{dc} \quad (18)$$

The previous equation and equation (15) can be combined to obtain:

$$I_{ac}^2 = \frac{k_{dc}}{k_I}(V_{dc}^2 - V_0^2) \quad (19)$$

Therefore the intensity $I_{ac}$ of the signal to be measured is deduced directly from the measurement $V_{dc}$ output by the voltmeter 58.

Obviously, the signal to be measured may be applied to the fixed conducting areas 46 or 61, the mobile electrode being connected to the ground plane. The same is true for the control circuit that can inject charges into the fixed electrode rather than into the mobile electrode.

The components described above have the advantage that they can be integrated into an integrated circuit with their control circuit.

Component 1 performing the function of a delay line has no high frequency limit, and offers a very wide adjustment range and high precision. However, its integration ratio is limited due to the presence of inductances.

Components 40 and 60 perform the signal measurement function operating with signals with a very wide frequency range. They have an excellent measurement precision with high linearity and a range of more than 40 dB. They are also almost insensitive to temperature variations. They can be used to very precisely measure powers varying from 100 µW to 1 W with an overload tolerance of up to 10 W. They also introduce low insertion losses and have a low voltage standing wave ratio over a very wide frequency band.

The invention claimed is:

1. Electronic component comprising:
   at least one micro-electromechanical capacitor with adjustable capacitance comprising two electrodes free to move with respect to each other, and
   means to create an electrostatic force capable of moving one of the two electrodes with respect to the other electrode and thus adjusting the capacitance of the capacitor,
   wherein said means to create an electrostatic force comprises a control circuit including:
   a loop with a measurement input, a control input, and an output, and
   a current source outputting a measurement current to the measurement input;
   and wherein said loop comprises:
   a comparator having a first input connected to the measurement input, a second input connected to the control input, and an output providing a comparison signal,
   first and second DC current sources outputting respective currents of equal intensities and reverse polarities, and
   a switch selectively connecting the first DC current source or the second DC current source to the measurement input, depending on the comparison signal.

2. Electronic component according to claim 1, wherein said current source outputting the measurement current is an alternating current source and wherein the loop comprises a rectifying means connected between the measurement input of the loop and the first input of the comparator.

3. Electronic component according to claim 2, wherein the control circuit further comprises a squaring amplifier connected between the control input of the loop and the second input of the comparator.

4. Electronic component according to claim 1, integrated in an integrated circuit.

5. Electronic component according to claim 2, wherein the control electrode is one of the two electrodes of the capacitor.

6. Electronic component according to claim 2, wherein signals processed by the component and the alternating current source have respective first and second frequencies, and wherein the second frequency is lower than and remote from the first frequency.

7. Electronic component according to claim 1, wherein the control electrode is mechanically coupled to one of the two electrodes and electrically isolated from this one electrode.

8. Electronic component according to claim 1, wherein the electronic component comprises a plurality of micro-electromechanical capacitors with adjustable capacitance each comprising a first and a second electrode free to move with respect to each other, the first electrodes of the capacitors being interconnected in series by conducting tracks in the form of a winding and each forming an inductance so as to form a chain of electrodes, the ends of which electrodes are connected to two corresponding connection terminals of the component through two corresponding conducting tracks in the form of a winding, each winding forming an inductance, the second electrodes of the capacitors being connected to a ground plane.

9. Electronic component according to claim 1, wherein one of the two electrodes has two connection terminals and a length between the two connection terminals equal to a quarter of the wavelength of the signals processed by the component, so as to form a quarter wave impedance transformer.

10. Electronic component according to claim 1, wherein the component comprises a plurality of micro-electromechanical capacitors with adjustable capacitance comprising two electrodes free to move with respect to each other, one of the mobile electrodes in each of the capacitors having two connection terminals connected to corresponding connection terminals of the component and the corresponding lengths between the two connection terminals being different from each other, so as to form a set of quarter wave impedance transformers connectable in series, so as to adapt the total length of the capacitors interconnected in series to the wavelength of the signals processed by the component.

11. Electronic component according to claim 1, wherein the component is configured to measure at least one characteristic of a signal applied to one of the two electrodes of the capacitor, the control circuit being designed to keep the distance between the electrodes of the capacitor constant, independently of the signal applied to one of the two electrodes.

12. Electronic component according to claim 11, wherein the control circuit is coupled to means of measuring the voltage applied to the control electrode, that is proportional to the average voltage of the signal applied to one of the two electrodes.

13. Electronic component according to claim 11, wherein the distance between the two electrodes is balanced in the absence of a signal, the control circuit including means of keeping the distance between the electrodes at a value other than the equilibrium value.

14. Electronic component according to claim 11, wherein the component is configured to measure the average power of the signal applied to one of the two electrodes.

15. Electronic component according to claim 11, wherein the component is configured to measure the average intensity of the signal applied to one of the two electrodes.

16. Electronic component according to claim 12, wherein the distance between the two electrodes is balanced in the absence of a signal, the control circuit including means of keeping the distance between the electrodes at a value other than the equilibrium value.

17. Electronic component according to claim 12, wherein the component is configured to measure the average power of the signal applied to one of the two electrodes.

18. Electronic component according to claim 13, wherein the component is configured to measure the average power of the signal applied to one of the two electrodes.

19. Electronic component according to claim 12, configured to measure the average intensity of the signal applied to one of the two electrodes.

20. Electronic component according to claim 13, configured to measure the average intensity of the signal applied to one of the two electrodes.

* * * * *